United States Patent [19]

Jaskolski et al.

[11] Patent Number: 4,638,253

[45] Date of Patent: Jan. 20, 1987

[54] MUTUAL INDUCTANCE NMR RF COIL MATCHING DEVICE

[75] Inventors: Patrick L. Jaskolski, Wauwatosa; Matthew G. Eash, Oconomowoc, both of Wis.

[73] Assignee: General Electric Company, Milwaukee, Wis.

[21] Appl. No.: 665,487

[22] Filed: Oct. 29, 1984

[51] Int. Cl.[4] ............................................ G01R 33/20
[52] U.S. Cl. ..................................... 324/318; 324/322; 324/311
[58] Field of Search ............... 324/307, 309, 311, 318, 324/322, 320, 314

[56] References Cited

U.S. PATENT DOCUMENTS 4,129,822  12/1978  Traficante ............................ 324/322
4,320,342  3/1982  Heinzerling .......................... 324/320

FOREIGN PATENT DOCUMENTS 2225899  12/1973  Fed. Rep. of Germany ...... 324/322

Primary Examiner—Stewart J. Levy
Assistant Examiner—Kevin D. O'Shea
Attorney, Agent, or Firm—Alexander M. Gerasimow; Douglas E. Stoner

[57] ABSTRACT

A matching device uses mutual inductance to couple an NMR radio frequency (RF) coil to an RF power amplifier and RF receiver preamplifier. The device includes a matching coil connected to the RF power amplifier and preamplifier and which is positioned between the NMR RF coil and a decoupling shield in a region where RF flux density, produced by the NMR RF coil, is maximum. This ensures effective coupling to the NMR RF coil and provides a way for adjusting the degree of coupling (hence, input impedance) by varying the area of the matching coil available for intercepting the RF flux.

8 Claims, 9 Drawing Figures

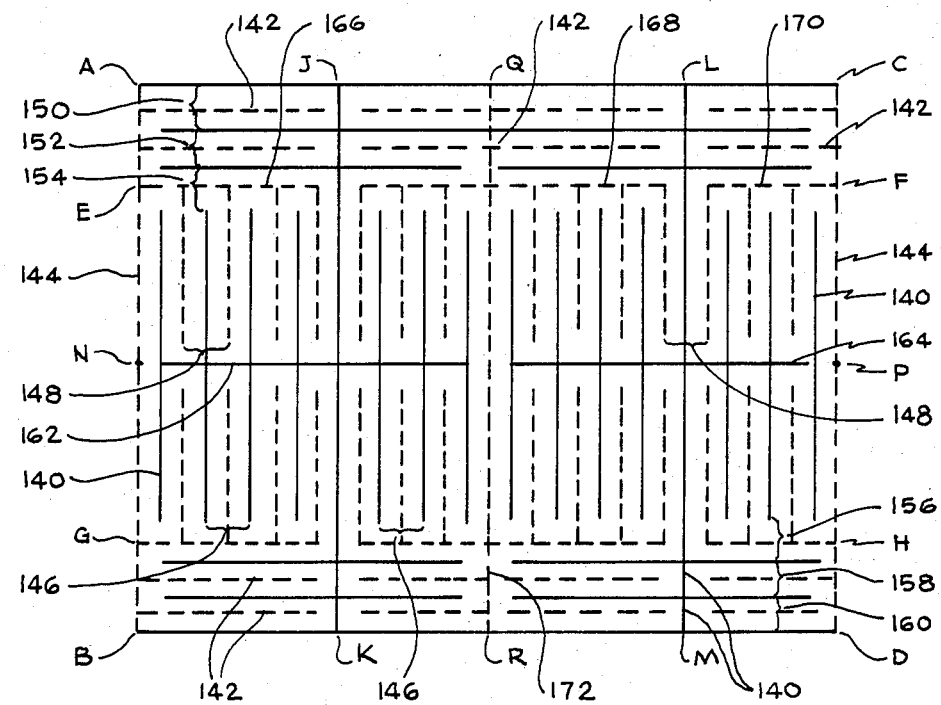
FIG. 8
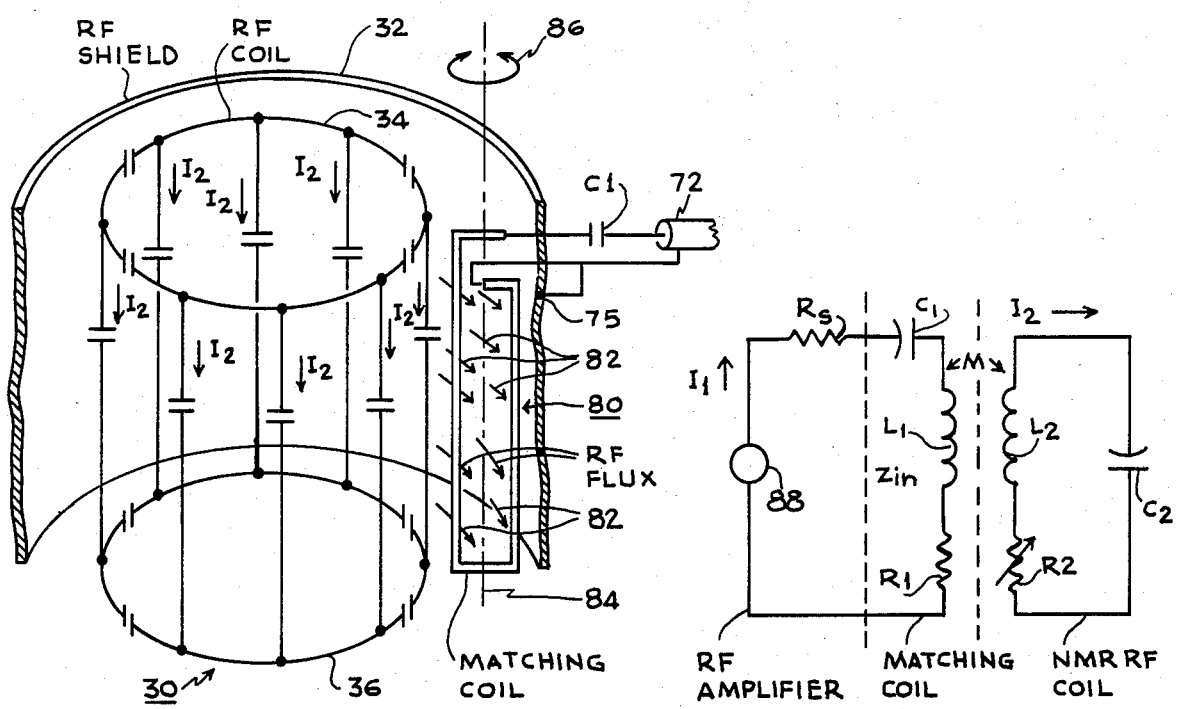
FIG. 3
FIG. 4

MUTUAL INDUCTANCE NMR RF COIL MATCHING DEVICE

BACKGROUND OF THE INVENTION

This invention relates to nuclear magnetic resonance (NMR) apparatus. More specifically, the invention relates to an impedance matching device which utilizes mutual inductance to couple an NMR radio frequency (RF) coil to an RF power amplifier and RF receiver preamplifier which form part of an NMR scanner.

The nuclear magnetic resonance phenomonen has been utilized in the past in high resolution NMR spectroscopy instruments by structural chemists to analyze the structure of chemical compositions. More recently, NMR has been developed as a medical diagnostic modality having applications in imaging the anatomy, as well as in performing in vivo, non-invasive, spectroscopic analyses. As is now well known, the NMR resonance phenomonen can be excited within a sample object, such as a human patient, positioned in a polarizing magnetic field, by irradiating the object with RF energy at the Larmor frequency. In medical diagnostic applications, this is typically accomplished by positioning the patient to be examined in an RF coil having a cylindrical geometry, and energizing the RF coil with an RF power amplifier. Upon cessation of the RF excitation, the same or a different RF coil and an RF preamplifier are used to receive the NMR signal emanating from the patient volume lying within the field of the RF coil. The NMR signal is usually observed in the presence of linear magnetic field gradients used to encode spatial information into the signal. In the course of a complete NMR scan, a plurality of NMR signals are typically observed. The signals are then used to derive NMR imaging or spectrosopic information about the object studied.

To ensure maximum power transfer between the RF power amplifier and the RF coil, as well as between the coil and the NMR receiver preamplifier, the coil input impedance must match the amplifier output impedance and the preamplifier input impedance. Additionally, the RF coil impedance must match the characteristic impedance of the transmission line coupling the RF coil to either the RF power amplifier or the preamplifier. This can be achieved by using adjustable impedance matching networks. A problem which arises with conventional NMR RF coil matching networks is that such circuits are dependent for proper operation on the quality factor, Q, of the coil which is subject to change with the size of the object in it. Thus, a large person (e.g., one weighing over 220 pounds) will lower the Q of the coil much more than a smaller person. A lower value of Q generally results in an impedance mismatch because a drop in the value of Q results in a concomitant reduction in the input impedance of the coil.

To regain optimum input impedance, conventional matching networks require either electrical connections to be moved, capacitor values substituted, or variable capacitors or inductors to be adjusted. However, the substitution of components having discrete values or the movement of electrical connections may permit only a finite number of NMR RF coil loads to be impedance matched. Equally undesirable is the use of adjustable capacitive and inductive elements near the bore of an NMR magnet due to their affect on the homogeneity of magnetic fields.

It is, therefore, a principal object of the present invention to provide an NMR RF coil impedance matching device which overcomes the shortcomings of the conventional device as discussed hereinabove.

It is another object of the invention to provide an NMR RF coil impedance matching device utilizing variable mutual inductance to effectively match a plurality of loads over a wide range of load impedances.

SUMMARY OF THE INVENTION

An NMR scanner apparatus includes an RF coil for transmitting and receiving radio frequency signals. When the coil is operated in the transmitting mode, it is coupled to a source of RF energy. In the receiving mode, the RF coil is coupled to a radio frequency receiver. A matching coil is provided for coupling the NMR RF coil to the source of RF energy and to the receiver using mutual inductance. To this end, in operation, the matching coil is disposed in the magnetic flux field of the RF coil.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

FIG. 3 is similar to FIG. 2 but depicts one exemplary embodiment of the inventive NMR RF coil impedance matching device utilizing variable mutual inductance;

FIG. 4 is a circuit schematic representation of the manner of exciting an RF coil in accordance with the invention utilizing variable mutual inductance;

FIG. 8 depicts one embodiment of an RF shield useful with the invention for energizing an RF coil;

DETAILED DESCRIPTION OF THE INVENTION

Figure 1:
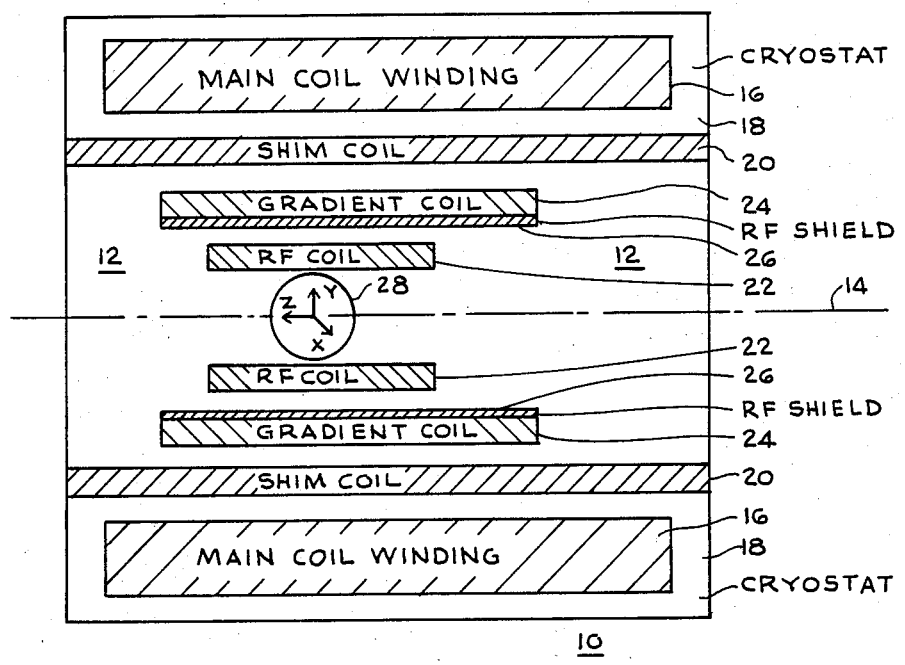
FIG. 1 is a cross-sectional view of an NMR scanner magnet including RF, gradient, and shim coil assemblies, as well as an RF shield.

FIG. 1 depicts a side cross-sectional view of an NMR magnet generally designated 10 for producing a polarizing magnetic field. In the ensuing discussions, the magnet is described as being of superconductive design, however, this is merely exemplary and other magnet designs may be utilized. The magnet is of a solenoidal construction having a cylindrical bore 12 centered about a longitudinal axis 14, and is provided with a set of main coil windings 16 which, when energized, produce a polarizing magnetic field. In a superconductive magnet, the coils are disposed within a cryostat 18 containing suitable cryogens, such as liquid helium and nitrogen, for maintaining the windings at superconductive temperatures characteristic of the material used in the coils. One or more sets of resistive or superconductive shim coils designated 20 are advantageously placed adjacent to the main coil windings. The shim coils operate to correct for magnetic field inhomogeneities inherent in the polarizing field produced by windings 16. Superconductive shim coils would, of course, be housed within cryostat 18. An RF coil assembly 22 is positioned coaxially inside a gradient coil assembly 24 which is disposed adjacent to the shim coils. An RF decoupling shield 26 is positioned coaxially between the RF and gradient coil assemblies and functions to decouple the two coils. Essentially, the shield acts as a low-pass filter allowing gradient magnetic field pulses having frequencies in the audio range to pass therethrough unimpeded, while acting substantially as a short circuit at RF frequencies thereby avoiding the undesirable effects of the gradient coil coupling to the RF coil. In use, a region of a patient (not shown) to be examined is aligned with a generally spherical volume 28 within the bore of the magnet where the polarizing and RF magnetic fields are homogeneous and where the gradient magnetic fields produced by the coil assemblies are linear.

Figure 2:
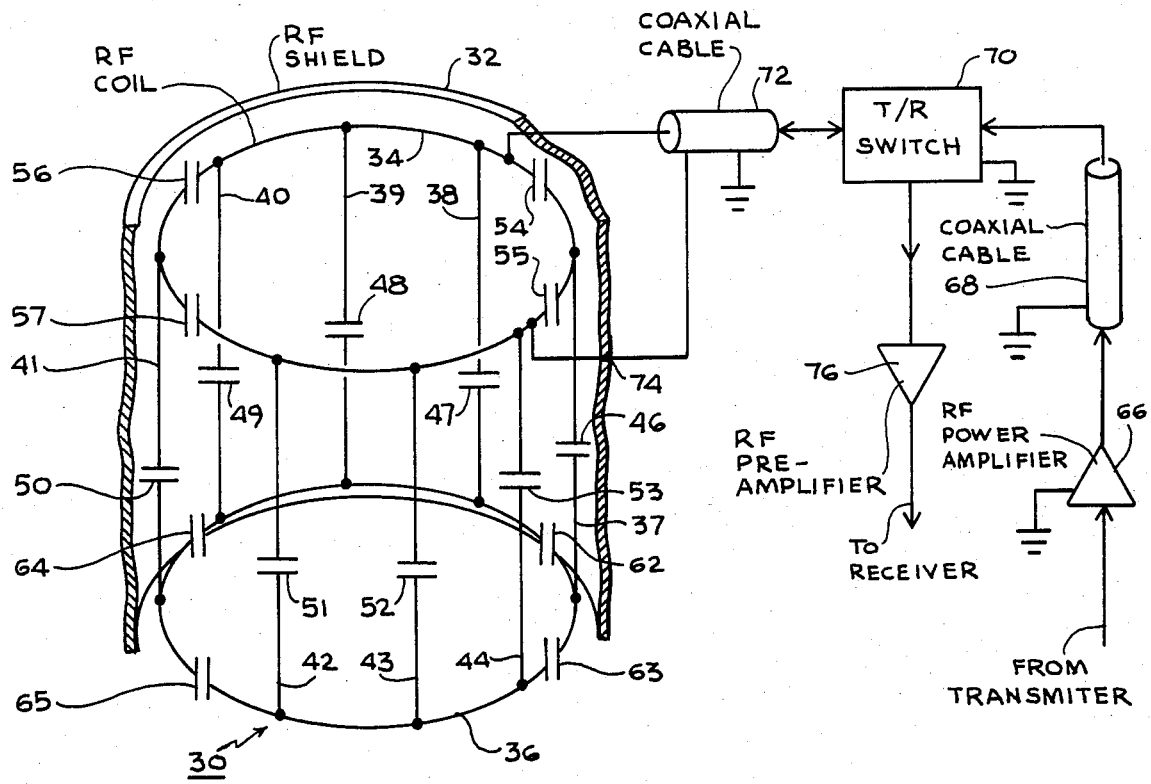
FIG. 2 depicts one conventional method for directly exciting an NMR RF coil and includes a breakaway view of an RF shield.

The overall NMR scanner configuration has been described in general terms with reference to FIG. 1. A more detailed description of the RF coil, the RF shield, and the manner in which the coil is directly energized in accordance with one conventional method will now be undertaken with reference to FIG. 2. The RF coil, generally designated by reference numeral 30, is shown as being surrounded by an RF shield 32 shown as partially cut away to preserve figure clarity. The RF coil comprises a pair of conductive loop elements 34 and 36 which are interconnected by eight axial conductive segments 37-44. Each of the axial conductive segments is provided with at least one capacitive element, such as those designated 46-53 corresponding, respectively, to capacitors in segments 37-44. Conductive loop element 34 is provided with a first pair of serially connected capacitors 54 and 55 located in the loop element on either side of axial conductive segment 37. A second pair of serially connected capacitors 56 and 57 is connected in loop 34 on either side of axial conductive segment 41 disposed diametrically opposite conductive segment 37. Similarly, conductive loop 36 is provided with capacitor pairs 62-63 and 64-65 connected on either side of conductive axial segments 37 and 41, respectively. The function of capacitors 54-57 and 62-65 is to prevent the circulation of eddy currents in the loop elements due to the pulsed application of magnetic field gradients utilized in NMR imaging applications and to provide the correct driving point impedance. Although not shown separately in FIG. 2, conductive portions of loop elements 34 and 36 have associated therewith an inherent inductance which is needed in combination with the capacitive elements disposed in the conductive axial segments to achieve proper coil operation. Additionally, the RF coil depicted in FIG. 2 is shown as having eight axial conductive elements. In practice, however, the coil is not so limited and may be constructed with more or fewer segments, with the realization that the greater the number of segments the greater the homogeneity of the resulting RF field.

The RF coil is energized by an RF power amplifier 66 receiving an input RF signal from a transmitter (not shown). The ouput of the RF amplifier is applied across capacitive elements 54 and 55, for example, through a coaxial cable 68, a transmit/receive switch 70, and a second coaxial cable 72. The center conductor of coaxial cable 72 is connected to the one side of serially connected capacitors 54 and 55, while the shield thereof is connected to the other side and is also grounded to RF shield 32 at a point 74. When the RF coil operates as a receiving antenna, the received NMR signals are applied through coaxial cable 72 and transmit/receive switch 70 to an RF preamplifier 76 and thence to an RF receiver (not shown). The RF coil is disclosed and claimed in commonly assigned U.S. patent application Ser. No. 548,745, which is incorporated herein by reference.

The direct drive method of energizing the RF coil described hereinabove with reference to FIG. 2 works satisfactorily in many applications. However, there are drawbacks associated therewith. As already indicated, impedance of the coil varies with the size of the imaged object, with impedance decreasing as the object becomes larger. This results in an impedance mismatch between the coil and the RF amplifier decreasing the efficiency with which power is coupled to the coil. Additionally, since the output impedance of the RF power amplifier is set at an industry standard impedance of 50 Ohms, the input impedance of the coil must be maintained very close to this value. To achieve this, capacitors 54 and 55 across which the RF coil is energized must be small (on the order of 100 to 200 picofarads) due to the fact that impedance increases with decreasing capacitance. The requirement that these capacitors be small to obtain the desired coil impedance is in conflict with the requirement that the capacitors be made as large as possible to avoid premature coil failure as a result of high voltages induced across the capacitors due to high RF currents. Such high voltages can cause a premature failure of the RF coil due to breakdown of the capacitor dielectric. Another drawback associated with the direct drive method of exciting an RF coil results from the requirement that the coil must be enclosed in the RF shield to decouple the RF and gradient coils, and the requirement that the RF coil and the shield must be grounded to the coaxial drive cable (at a point such as that designated 74 in FIG. 2) to minimize impedance changes due to placement and movement of the cable. The connection of the shield and RF coil to the coaxial cable results in a current imbalance when the coil is energized due to the stray capacitances developed between the coil and the shield as a result of their proximity to one another. The current imbalance results in an inhomogeneous RF field which can cause image artifacts to occur. The current imbalance can be eliminated by utilizing a conventinal balun, but such devices have been shown to be difficult to maintain in an NMR system. The current imbalance can also occur if the coil resonant frequency is slightly different from the frequency of the RF excitation provided by the RF amplifier. A current imbalance causes more voltage to occur in one section of the coil. This in turn can lead to image artifacts and to premature dielectric failure due to excess voltage.

The manner in which the aforedescribed shortcomings associated with the conventional NMR RF coil drive method are overcome in accordance with the invention will now be described with reference to FIGS. 3 and 4. Referring first to FIG. 3, there is shown an RF coil 30 positioned within a shield 32 substantially identical to the shield and coil described hereinbefore with reference to FIG. 2 and wherein like parts are assigned like reference numbers. Additionally, there is shown in FIG. 3 a matching coil 80 comprised of an elongated conductive loop positioned between the RF coil and the shield and coupled at one of its ends through a capacitor $C_1$ to the center conductor of coaxial power feed cable 72 and at its other end to the RF shield (at a point designated 75) and to the outside conductor of the coaxial cable. Matching coil 80 is positioned relative to RF coil 30 at a location having maximum RF flux density, exemplified by arrows 82, at the resonant frequency of the RF coil. RF energy applied to the matching coil through coaxial cable 72 is coupled by variable mutual inductance (transformer action) to the RF coil. The degree of coupling between the matching coil and the flux is dependent on the effective area of the matching coil available for coupling to the flux and the coupling coefficient between the matching coil and the RF coil. Maximum coupling occurs when the plane of the matching coil is perpendicular to the RF flux represented by arrows 82.

In accordance with the one embodiment of the invention, the degree of coupling can be varied by rotating matching coil 80 about a longitudinal axis 84 in the directions indicated by bidirectional arrow 86 so as to present a variable matching coil area through which flux can be coupled. In general, it is desirable to construct a matching coil having an area large enough to provide a high degree of coupling between the matching and RF coils.

A more detailed description of the operation of the inventive method utilizing variable mutual inductance for energizing the RF coil will now be undertaken with reference to FIG. 4 which depicts in schematic form the RF coil, the matching coil, and the RF power amplifier. The matching coil is represented in FIG. 4 by an inductance $L_1$ having connected in series therewith capacitor $C_1$ and a resistor $R_1$ which, for the purposes of this discussion, is assumed to be negligibly small. The capacitance and inductance associated with the NMR RF coil are shown as lumped elements $C_2$ and $L_2$, respectively, with $L_2$ and $L_1$ being coupled by a mutual inductance designated "M". There is also shown in series with inductor $L_2$ and capacitor $C_2$ a variable resistive element designated $R_2$. Resistor $R_2$ is shown as a variable element to indicate the fact that the quality factor Q of the NMR RF coil varies with varying patient size. For example, with a large patient, the Q of the coil decreases. This is equivalent to an increase in the value of $R_2$. Maximum power transfer is attained when the output impedance $R_s$ of an RF power source 88 is equal to the impedance $Z_{in}$ appearing across the matching coil. This condition also results in the maximum current $I_2$ flow in the NMR RF coil. That is, $I_2$ is maximum when $$I_2 \text{ is max when } R_s = \frac{\omega^2 M^2}{R_2}, \quad (1)$$

wherein $\omega$ is the resonant frequency on the RF coil and M is the mutual inductance coupling coefficient between the matching coil and the NMR RF coil. This relationship holds true when the capacitors and inductors in the coil are at resonance, as would be the case in normal operation, wherein the matching and RF coils are designed to resonate at the Larmor frequency of the nuclei of interest and the RF source frequency is equal to the desired resonant frequency.

It will be evident from Equation (1) that $Z_{in}$ is dependent upon the value of resistor $R_2$ which, as indicated, is related to the coil quality factor Q. The change in the quality factor Q therefore results in a change in the input impedance, $Z_{in}$, seen by the RF power source resulting in an impedance mismatch. In accordance with the invention and as is evident from the equation stated above, the value of $Z_{in}$ can be adjusted by varying the coupling between the matching coil inductance $L_1$ and the NMR RF coil inductance $L_2$. The degree of coupling is indicated by the mutual inductance coupling factor M. As already indicated hereinbefore, the degree of coupling can be adjusted by rotating matching coil 80 in FIG. 3 so as to vary the area enclosed by the coil loop available for coupling to the RF flux. Rotation of the matching coil has the effect of changing the mutual inductance M, but has very little effect on the self-inductance $L_1$ of the matching coil due to the fact that the length and the geometry thereof do not change as a result of the rotating motion. Consequently, capacitor $C_1$, which is utilized to balance the self-inductance of the matching coil, need not be adjusted as various size patients are positioned within the NMR RF coil.

It should be recognized that the method described for varying the coupling between the NMR RF coil and the matching coil by rotating the latter is merely exemplary and that other methods, such as varying the distance between the matching and the RF coil to positions where the RF flux density is greater or lesser, may also be advantageously employed.

Figure 5A:
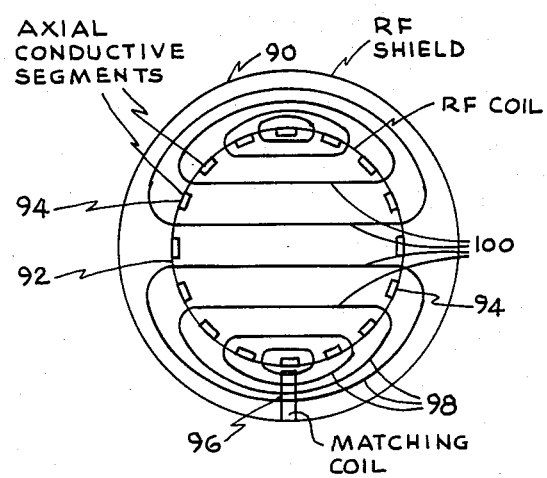
FIG. 5A is an end view of an NMR RF coil such as that depicted in FIG. 3 showing RF flux distribution and the preferred position of the inventive matching coil for generating a linearly polarized RF field.

FIG. 5A is an end view of coaxially disposed RF shield 90 and an RF coil 92 having 16 axial conductive segments such as the two designated by way of example with the reference numeral 94. There is also shown the preferred position for a matching coil 96 for producing a linearly polarized RF magnetic field particularly useful in NMR imaging. Matching coil 96 is positioned in the region between the RF coil and the shield having the greatest RF flux density as suggested by the relative proximity of flux lines 98. The flux configuration depicted in FIG. 5A is for the coil resonant mode in which the current in the axial conductive segments has a sinusoidal distribution with the result that the RF flux on the interior of the RF coil is uniform as suggested by flux line portions 100.

Figure 5B:
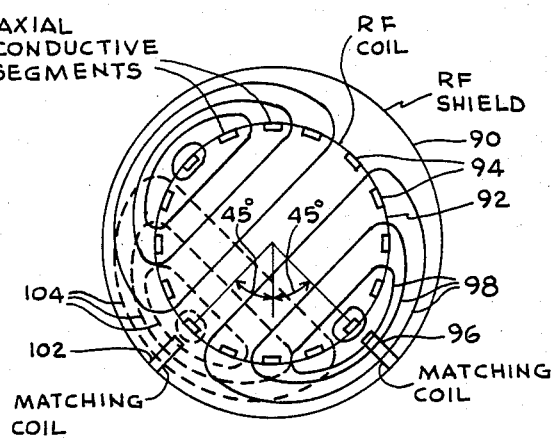
FIG. 5B is similar to FIG. 5A but in addition depicts flux distribution in the orthogonal resonant mode and the preferred positions for the inventive matching coils for exciting a circularly polarized RF field.

FIG. 5B is substantially identical to FIG. 5A and in which like parts are assigned like reference numerals. FIG. 5B depicts an embodiment in accordance with the invention for utilizing variable mutual inductance to energize an RF coil so as to produce a circularly polarized magnetic field. As is known, circularly polarized magnetic fields offer power reduction advantages and signal-to-noise ratio improvements in NMR applications. The notable difference between FIG. 5B and FIG. 5A is that in FIG. 5B a second matching coil 102 is provided. Coils 96 and 102 are displaced 45° from vertical, as shown in FIG. 5B so that the coils are separated by 90° along the circumference of the RF coil. This configuration avoids uneven loading of the RF coil when studying asymmetrical subjects. The location for matching coil 102 is selected to coincide with the maximum RF flux density associated with the resonant mode orthogonal to that designated by solid lines in FIG. 5B and described with reference to FIG. 5A. The flux associated with the orthogonal mode is indicated in FIG. 5B by dashed lines and the coil is positioned in the region of maximum flux density identified by reference numeral 104. In order to couple to the orthogonal resonant modes, matching coils 96 and 102 are energized at the resonant frequency of the matching and RF coils by RF power sources (not shown) having phases which are displaced relative to one another by 90 electrical degrees. In the preferred embodiment, this is achieved by utilizing one of several known four port devices, such as a quadrature hybrid device 106 depicted in FIG. 6.

Figure 6:
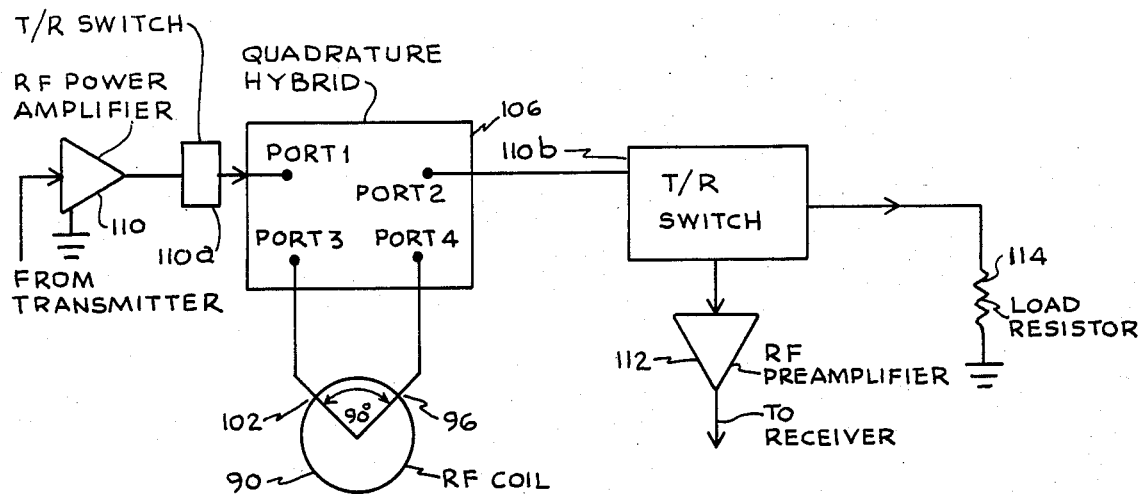
FIG. 6 is a block circuit diagram of the preferred embodiment for utilizing quadrature excitation to produce a circularly polarized RF field.

Continuing now with reference to FIG. 6, the output of an RF power amplifier 108 is applied through transmit/receive switch 110a to port 1 of the quadrature hybrid where it is divided into two substantially equal magnitude signals that are 90° out of phase relative to one another. The two signals resulting from the power division appear at ports 3 and 4 and are applied to matching coils, such as those designated 96 and 102 described with reference to FIG. 5B. In the receive mode, the NMR signals received by the RF coil are applied to ports 3 and 4 and are properly phased in the quadrature hybrid such that substantially all of the signal appears at port 2 where it is applied through a transmit/receive switch 110b to an RF preamplifier 112 and then to an NMR receiver (not shown). A matched load resistor 114 is shown coupled to port 2 of the quadrature hybrid through the transmit/receive switch to ensure proper operation during the transmit cycle. Examples of other suitable four-port devices include, but are not limited to, ring hybrids, symmetric couplers, asymmetric couplers, tapered line couplers and lumped element couplers.

Figure 7:
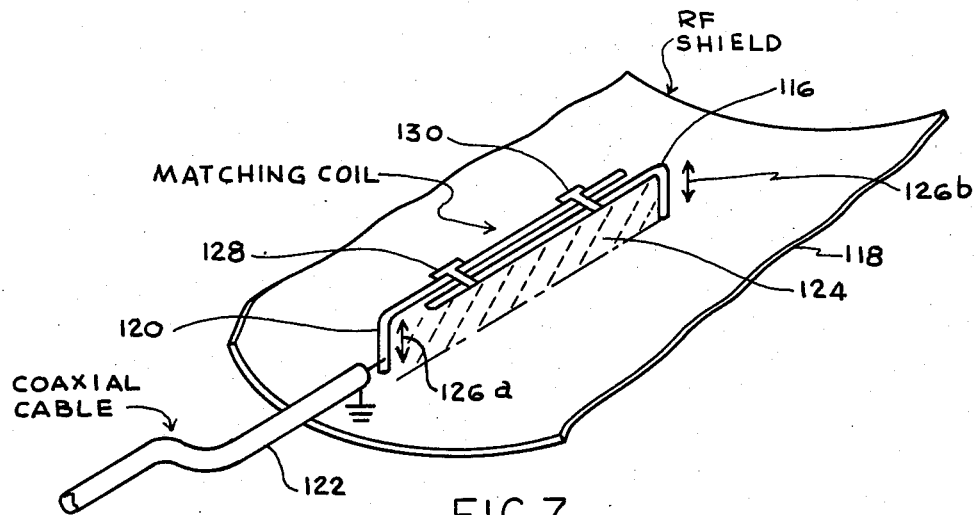
FIG. 7 depicts in greater detail another exemplary embodiment of the inventive impedance matching coil advantageously utilized with the embodiments depicted in FIGS. 5A and 5B.

An alternative embodiment of the matching coil in accordance with the invention is depicted in FIG. 7. The coil comprises an angled conductive element 116 having an elongated portion disposed parallel to an RF shield 118 and being electrically connected thereto by a shorter perpendicular segment. A second angled conductive element 120 has its elongated portion disposed parallel to that of element 116 and is spaced therefrom so as to create a narrow gap. The perpendicular shorter portion of element 120 is connected to the center conductor of a coaxial cable 122 which is coupled to an RF source (not shown) and which has its external conductor grounded to the shield 118. Conductive elements 116 and 120 define an area 124 indicated by dashed lines between the elongated element portions and the RF shield. This area determines the degree of coupling between the matching and RF coils. The gap between elements 116 and 120 corresponds to the capacitive element $C_1$ described with reference to FIG. 4, while the conductive elements correspond to inductance $L_1$. One way for adjusting the area without replacing the conductive elements is to adjust the height thereof relative to the shield as is suggested by bi-directional arrows 126a and 126b. The value of capacitance $C_1$ can be varied, for example, by narrowing or widening the gap between elements 116 and 120 by adjusting a pair of screws 128 and 130. In practice, the area and the capacitance are adjusted to some empirically determined value which does not create an unacceptable impedance mismatch for most patients expected to be scanned, since some deviation from the exact impedance-match condition can be tolerated.

Several advantages may be realized as a result of the inventive method of energizing the RF coil utilizing variable mutual inductance. For example, capacitive elements 54–57 and 62–65 disposed in conductive loop elements 34 and 36, respectively, as shown in FIG. 2, can now be made larger so that voltage drops developed thereacross are smaller, thus helping eliminate dielectric breakdown. This is an advantage, since these capacitors have the smallest values in the RF coil (necessitated by the need for the high input impedance) and, hence, would be first to fail under high voltage conditions. Additionally, the nature of the impedance provided by utilizing the inventive method is real (due to resonant conditions needed to properly excite the RF coil) and can be set to high levels by increasing the area of the matching coil for coupling to the magnetic field flux. Another advantage is that the NMR RF coil no longer needs to be directly connected to the shield at any point, as is the case with the conventional drive illustrated in FIG. 2 where the RF coil is coupled to the shield at a point 74. This allows the coil to "float," in an electrical sense, and automatically balance itself as determined by the stray capacitance. In accordance with the invention, the matching coil is grounded to the shield at a point 75 in FIG. 3 such that the shield is used as an integral part of the inductive drive thereby eliminating the need for a balun, while providing a stable input impedance for the RF power amplifier. For off-frequency operation of the coil, the energy transfer from the power amplifier to the RF coil is minimized by the resonant flux pattern. That is, if the coil is not resonating (i.e., it is being energized by an RF source having a frequency which differs from the resonant frequency of the RF coil), the amplifier will not be capable of coupling power into the coil, since the coil will not provide the necessary magnetic field flux pattern to couple to the matching coil. This is desirable as a self-protective mechanism not provided by the conventional direct drive method of energizing the RF coil.

One embodiment of the NMR RF shield useful with the RF coil described herein is depicted in FIG. 8. The shield is disclosed and claimed in application Ser. No. 562,121, filed Dec. 16, 1983 and which is incorporated herein by reference. Briefly, FIG. 8 depicts the etched pattern to be used on the two conductive surfaces of a double-sided printed circuit board separated by a dielectric material. The solid lines (e.g., 140) designate the areas to be etched on the inner conducting sheet on the printed circuit board (i.e., the conducting sheet which will form the inner cylindrical surface of the shield), while the dotted lines (e.g., 142) designate the areas to be etched on the outer conducting sheet. The etched printed circuit board can be formed into a cylinder for accepting therein the NMR RF coil by soldering edges A–B and C–D of the inner conductive sheets. The edges of the outer conductive sheet are not electrically connected and form a gap as suggested by dashed lines 144 connecting points A–B and C–D. The inner and outer conductive sheets in a central rectangular region defined by letters E, F, G, and H of the shield are etched to create a plurality of vertical conductive strips 146 and 148, respectively, which parallel the axial conductive segments of the NMR RF coil. The etched lines on each of the inner and outer conducting surfaces are displaced relative to one another by one half of the strip width, for example, such that a gap on one conductive sheet is bridged by a coextensively situated conductive strip on the other conductor sheet. Conductive strips 150, 152, and 154 on the inner conductive sheet and conductive strips 156, 158, and 160 conduct currents corresponding to those flowing in conductive loop elements 34 and 36, respectively, of the NMR RF coil depicted in FIG. 3. Conductive loop element 34 is centered on strip 154, while conductive loop element 36 is centered on conductive strip 156. There are no discontinuities in these paths because etched areas located along lines whose extremities are designated by letters J and K, and L and M can be positioned at points along the loop peripheries where the current in the loop elements are at a minimum. Etched lines 162 and 164 do impede vertical current flow. These cuts are necessary, however, to prevent induced eddy currents in the shield. In this area of the coil, however, the coil current is spread out over a wide area so that current densities are lower across lines 162 and 164 than in strips 154 and 156. Additionally, larger areas of capacitive coupling bridge lines 162 and 164. Etched lines 166, 168, and 170 on the outer conductive sheet are located far from corresponding etched lines 162 and 164 on the inner conductive sheet to maximize the capacitive bridging across lines 162 and 164. Etched lines 144 and 172 form a gap in the completed shield on the outer conductive sheet. The gap prevents gradient-induced eddy current loops without producing any adverse effects on shield efficacy. It should be noted that none of the etched lines in the inner conductive sheet cross those on the outer conductive sheet. However, it may be desirable to permit such crossovers as, for example, by joining lines 162 and 164 to form a single continuous etched line between points N and P. In this case, all shield conductive elements, such as those designed 146, will offer substantially the same impedance to currents induced on the inner surface.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:
1. An NMR scanner apparatus comprising:
   RF coil means for transmitting and receiving radio frequency signals;
   first means for energizing said RF coil means when said coil is operated in the transmitting mode;
   means for receiving radio frequency signals when said coil is operated in the receiving mode; and
   first matching coil means for coupling said RF coil means to said means for energizing and means for receiving said matching coil means being disposed in the magnetic flux field of said RF coil, such that in operation said matching coil means and said RF coil means are coupled by mutual inductance.
2. The NMR scanner apparatus of claim 1 further comprising first means for adjusting the mutual inductance coupling between said matching coil means and said RF coil means.
3. The NMR scanner apparatus of claim 2 wherein said means for adjusting comprises means for varying the area of said matching coil means available for coupling to the magnetic flux field of said RF coil.
4. The NMR scanner apparatus of claim 1 or 2 further comprising shield means, said matching coil means being electrically grounded thereto, allowing said RF coil means to float in the electrical sense relative to said matching coil means and said shield means.
5. The NMR scanner apparatus of claim 1, 2, or 3 further comprising:
   second matching coil means for coupling said RF coil to said means for receiving said second matching coil means being disposed in the magnetic flux field of said RF coil and being physically displaced from said first matching coil means by 90° along the periphery of said RF coil; and
   means for energizing said second matching coil means, the output of said last-mentioned means being electrically displaced from said means for energizing said first matching coil means by 90°.
6. The NMR scanner apparatus of claim 5 further comprising second means for adjusting the mutual inductance coupling between said second matching coil means and said RF coil means.
7. The NMR scanner apparatus of claim 6 wherein said second means for adjusting comprises means for varying the area of said second matching coil means available for coupling to the magnetic field flux of said RF coil.
8. The NMR scanner apparatus of claim 7 further comprising shield means, said first and second matching coil means being electrically grounded thereto, allowing said RF coil means to float in the electrical sense relative to said each of said matching coil means and said shield means.

* * * * *